(12) United States Patent
Bothe et al.

(10) Patent No.: US 12,113,114 B2
(45) Date of Patent: Oct. 8, 2024

(54) TRANSISTOR WITH OHMIC CONTACTS

(71) Applicant: Wolfspeed, Inc., Durham, NC (US)

(72) Inventors: Kyle Bothe, Cary, NC (US); Evan Jones, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 379 days.

(21) Appl. No.: 17/508,846

(22) Filed: Oct. 22, 2021

(65) Prior Publication Data

US 2023/0130614 A1    Apr. 27, 2023

(51) Int. Cl.
*H01L 29/778* (2006.01)
*H01L 29/20* (2006.01)
*H01L 29/45* (2006.01)

(52) U.S. Cl.
CPC ........ *H01L 29/452* (2013.01); *H01L 29/2003* (2013.01); *H01L 29/7786* (2013.01)

(58) Field of Classification Search
None
See application file for complete search history.

(56) References Cited

U.S. PATENT DOCUMENTS

| | | |
|---|---|---|
| 6,849,882 B2 | 2/2005 | Chavarkar et al. |
| 7,126,426 B2 | 10/2006 | Mishra et al. |
| 7,230,284 B2 | 6/2007 | Parikh et al. |
| 7,501,669 B2 | 3/2009 | Parikh et al. |
| 7,550,783 B2 | 6/2009 | Wu et al. |
| 7,573,078 B2 | 8/2009 | Wu et al. |
| 9,847,411 B2 | 12/2017 | Sriram et al. |
| 2005/0253167 A1 | 11/2005 | Wu et al. |
| 2006/0202272 A1 | 9/2006 | Wu et al. |
| 2008/0128752 A1 | 6/2008 | Wu |
| 2010/0096667 A1* | 4/2010 | Nakajima ........... H01L 29/7783 257/256 |
| 2010/0276698 A1 | 11/2010 | Moore et al. |
| 2012/0049973 A1 | 3/2012 | Smith, Jr. et al. |
| 2012/0194276 A1 | 8/2012 | Fisher |
| 2014/0264454 A1* | 9/2014 | Banerjee ........... H01L 29/66462 257/194 |
| 2017/0077283 A1 | 3/2017 | Nakata |
| 2019/0165130 A1* | 5/2019 | Yoshida ............. H01L 29/7786 |
| 2019/0378899 A1 | 12/2019 | Radosavljevic et al. |

FOREIGN PATENT DOCUMENTS

CN      203733803 U    7/2014

OTHER PUBLICATIONS

International Search Report and Written Opinion of the International Searching Authority for PCT Application No. PCT/US2022/047253 mailed Feb. 9, 2023.

\* cited by examiner

*Primary Examiner* — Bilkis Jahan
(74) *Attorney, Agent, or Firm* — Sage Patent Group

(57) ABSTRACT

A transistor includes a semiconductor layer and a channel region. The transistor further includes a first doped contact region in the semiconductor layer and adjacent the channel region. The transistor further includes a first ohmic contact including an interface region comprising a first interface length between the first ohmic contact and the first doped contact region larger than a length of the interface region.

26 Claims, 8 Drawing Sheets

TRANSISTOR WITH OHMIC CONTACTS

BACKGROUND

The present disclosure relates to transistor structures and in particular to high electron mobility transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

FIG. 1 illustrates a conventional gallium nitride-based HEMT structure. The structure includes a substrate 10, which may be a semi-insulating 4H silicon carbide (SiC) substrate. Optional buffer, nucleation and/or transition layers (not shown) may be provided on the substrate 10. A channel layer 20 is provided on the substrate 10. The channel layer 20 may be a Group III-nitride, such as GaN. A barrier layer 22 is provided on the channel layer 20. The barrier layer 22 has a bandgap that is greater than the bandgap of the channel layer 20 and the channel layer 20 may have a larger electron affinity than the barrier layer 22. The barrier layer 22 may be AlN, AlInN, AlGaN or AlInGaN, and is thick enough and has a high enough Al composition and doping to induce a significant carrier concentration at the interface between the channel layer 20 and the barrier layer 22. This induced carrier concentration forms a 2DEG which provides a conductive channel in the device. The conductivity of the 2DEG channel can be modulated by applying a voltage to a gate contact 32 formed on the barrier layer 22.

FIG. 1 also illustrates a cap layer 24 on the barrier layer 22 with the gate contact 32 in a recess 36 through the cap layer 24. The cap layer 24 moves the top (outer) surface of the device physically away from the channel, which may reduce surface effects of the device. The cap layer 24 may be blanket formed on the barrier layer 22 and may be epitaxially grown and/or formed by deposition. Typically, the cap layer 24 may have a thickness of from about 2 nm to about 500 nm.

As is further illustrated in FIG. 1, ohmic source/drain contacts 30 are provided on the barrier layer 22, and a gate recess is provided through the cap layer 24 to expose a portion of the barrier layer 22. A gate contact 32 is formed in the recess and contacts the exposed portion of the barrier layer 22. The gate contact 32 may be a "T" gate as illustrated in FIG. 1.

Conventional HEMT structures may suffer from an undesirable ohmic contact resistance, which can contribute to an increased on-resistance of the transistor.

SUMMARY

A transistor according to some embodiments includes a semiconductor layer, a channel region, and a first doped contact region in the semiconductor layer and adjacent the channel region. The transistor further includes a first ohmic contact including an interface region including a first interface length between the first ohmic contact and the first doped contact region larger than a length of the interface region.

The semiconductor layer may be a group III nitride layer.

In some embodiments, a first resistance of the first ohmic contact is less than a second resistance of the channel region.

The first ohmic contact may be one of an ohmic source contact and an ohmic drain contact.

In some embodiments, the first interface length includes at least one indentation. The least one indentation may be a plurality of indentations. The plurality of indentations may be teeth with a space between adjacent teeth.

The plurality of indentations may be jagged shapes with a space between adjacent jagged shapes.

The channel region may have a width of 5 µm or less.

In some embodiments, the first doped contact region includes a first portion covered by the first ohmic contact and a second portion adjacent the channel region uncovered by the first ohmic contact.

In some embodiments, the transistor further includes a second doped contact region in the semiconductor layer and adjacent the channel region. The transistor further includes a second ohmic contact including a second interface length between the second ohmic contact and the second doped contact region larger than a length of the interface region.

In some embodiments, the second doped contact region comprises a first portion covered by the second ohmic contact and a second portion adjacent the channel region uncovered by the second ohmic contact.

In some embodiments, the second interface length includes at least at least one indentation. The at least one indentation may be a plurality of indentations. The plurality of indentations may be teeth with a space between adjacent teeth.

The plurality of indentations may be jagged shapes with a space between adjacent jagged shapes.

A depth of the at least one indentation may be between 1 µm and 5 µm.

A width of the at least one indentation may be between 1.4 μm and 3 μm.

The first ohmic contact may be an ohmic source contact or an ohmic drain contact. The second ohmic contact may be (i) an ohmic drain contact when the first ohmic contact is an ohmic source contact, or (ii) an ohmic source contact when the first ohmic contact is an ohmic drain contact.

In some embodiments, the second interface length includes at least one indentation that is misaligned with the at least one indentation of the second interface length.

In some embodiments, a depth of the at least one indentation may be between 1 μm and 5 μm.

In some embodiments, a width of the at least one indentation may be between 1.4 μm and 3 μm.

A high electron mobility transistor, HEMT, with ohmic source and drain contacts according to some embodiments includes a semiconductor layer, a channel region, a first doped contact region in the semiconductor layer and adjacent the channel region, and a second doped contact region in the semiconductor layer and adjacent the channel region. The HEMT further includes a first ohmic contact including an interface region including a first interface length between the first ohmic contact and the first doped contact region larger than a length of the interface region. The HEMT further includes a second ohmic contact including an interface region including a second interface length between the second ohmic contact and the second doped contact region larger than a length of the interface region.

The first resistance of at least one of the first ohmic contact and the second ohmic contact may be less than a second resistance of the channel region.

The first ohmic contact may be an ohmic source contact or an ohmic drain contact. The second ohmic contact may be (i) an ohmic drain contact when the first ohmic contact is an ohmic source contact, or (ii) an ohmic source contact when the first ohmic contact is an ohmic drain contact.

In some embodiments, the first interface length includes at least one indentation and the second interface length includes at least one indentation.

The at least one indentation of the first interface length may be misaligned with the at least one indentation of the second interface length.

A depth of the at least one indentation of at least one of the first and second interface lengths may be between 1 μm and 5 μm, and a width of the at least one indentation of at least one of the first and second interface lengths may be between 1.4 μm and 3 μm.

DETAILED DESCRIPTION OF EMBODIMENTS

Figure 1:
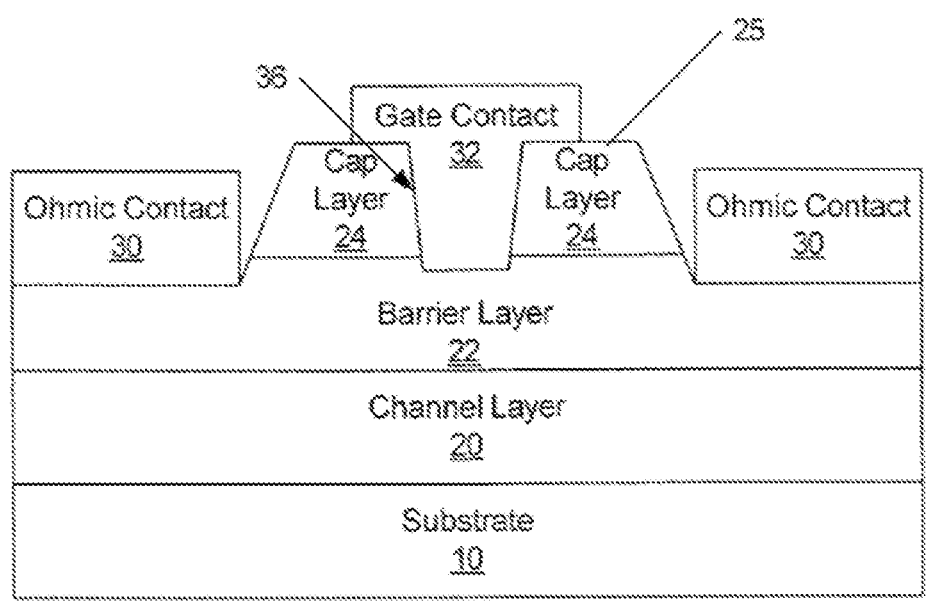
FIG. 1 is a cross-sectional view of a conventional transistor device.

Embodiments of the inventive concepts will now be described in connection with the accompanying drawings. Some embodiments described herein provide a transistor including a first ohmic contact that includes an interface region comprising a first interface length between the first ohmic contact and the first doped contact region larger than a length of the interface region. In some embodiments, the transistor further includes a second ohmic contact that includes an interface region comprising a second interface length between the second ohmic contact and the second doped contact region larger than a length of the interface region. In still further embodiments, the second interface length includes at least one indentation that is misaligned with at least one indentation of the second interface length.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending on the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to plan view illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Ohmic contact resistance in a transistor, such as GaN HEMT, can be a contributor to on-resistance in the transistor (also referred to herein as "total contact resistance"). To reduce such on-resistance, it is desirable to reduce the ohmic contact resistance of the transistor. Although not wishing to be bound by a particular theory, it is presently believed that when two ohmic contacts of a transistor both have a straight edge adjacent a channel region, total contact resistance of the transistor may be adversely affected. Some embodiments provide an ohmic contact(s) having an edge that includes indentations adjacent to a channel region. By including indentations on the edge, the periphery of the edge may be increased relative to an edge without indentations and, as a result, the total contact resistance may be improved.

Figure 2A:
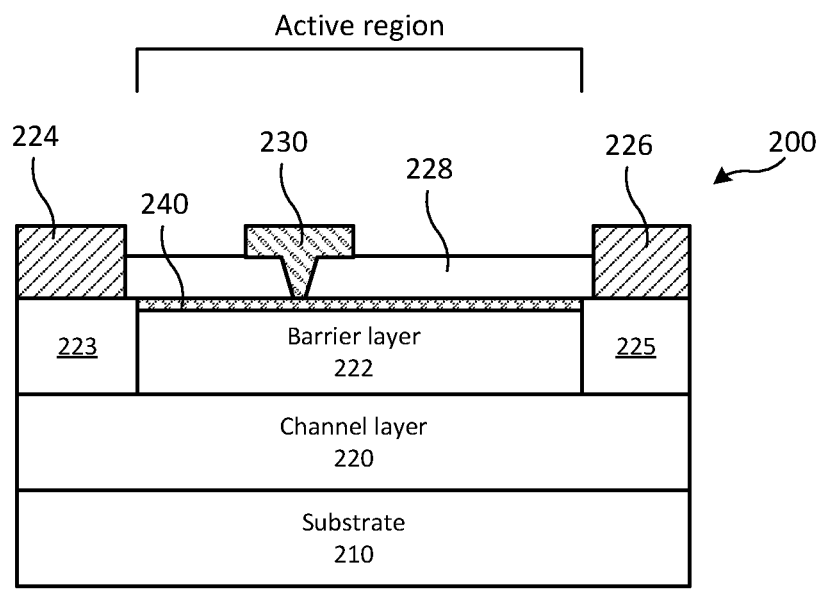
FIG. 2A is a schematic cross-sectional view of a HEMT device according to some embodiments.

A GaN HEMT structure 200 according to some embodiments is illustrated in FIG. 2A. As shown therein, the structure includes a substrate 210 on which a channel layer 220 is formed. A barrier layer 222 is formed on the channel layer. In some embodiments, barrier layer 222 and/or channel layer 220 may be a Group III-nitride, such as GaN. Doped contact regions 223, 225 are formed in the barrier layer 222 and may extend into the channel layer 220.

In some embodiments, doped contact regions 223, 225 may be in the barrier layer 222 or the channel layer 220 beneath one or more of ohmic contacts 224, 226. A bottom surface of the ohmic portion of the ohmic contact 224 and/or a bottom surface of the ohmic portion of the ohmic contact 226 may be in contact with respective ones of the doped contact regions 223, 225. The doped contact regions 223, 225 may be formed, for example, by implanting n-type dopants, such as silicon, into the surface of the barrier layer 222. When forming the doped contact regions 223, 225 in the channel layer 220, n-type dopants, such as silicon, may be implanted into the surface or the channel layer 220. In some embodiments, the doped contact regions 223, 225 may be doped to have a higher doping concentration than the barrier layer 222 or the channel layer 220. For example, when the barrier layer 222 is an n-type layer, the doped contact regions 223, 225 may be doped to have a higher concentration of n-type dopants (e.g., an N+ or N++) than the barrier layer 222.

In some embodiments, implanting dopants to form the doped contact regions 223, 225 may be performed after the formation of the barrier layer 222 or the channel layer 220 but before the formation of the ohmic contact 224 and/or the ohmic contact 226. While some embodiments are described with doped contact regions 223, 225 including implanted dopants, embodiments of the present disclosure are not so limited, and include doping the doped contact regions 223, 225 via other techniques. Other techniques include, without limitation, regrowth or surface treatment. For example, doped contact regions 223, 225 may be formed by regrowth in the barrier layer 222 or the channel layer 220 using an n-type dopant and metal organic chemical vapor deposition (MOCVD), molecular beam epitaxy (BME), plasma enhanced chemical vapor deposition (PECVD), puttering and/or hydride. For example, when the barrier layer 222 is an n-type layer, the doped contact regions 223, 225 may be doped to have a higher concentration of n-type dopants (e.g., an N+ or N++) than the barrier layer 222.

Ohmic contacts 224, 226 may include a metal that can form an ohmic contact to a gallium nitride based semiconductor material. Suitable metals may include refractory metals, such as Ti, W, titanium tungsten (TiWW), silicon (si), titanium tungsten nitride (TiWN), tungsten silicide (WSi), rhenium (Re), Niobium (Nb), Ni, gold (Au), aluminum (Al), tantlum (Ta), molybdenum (Mo), $NiSi_4$, titanium silicide (TiSi), titanium nitride (TiN), WSiN, Pt and the like.

Figure 2B:
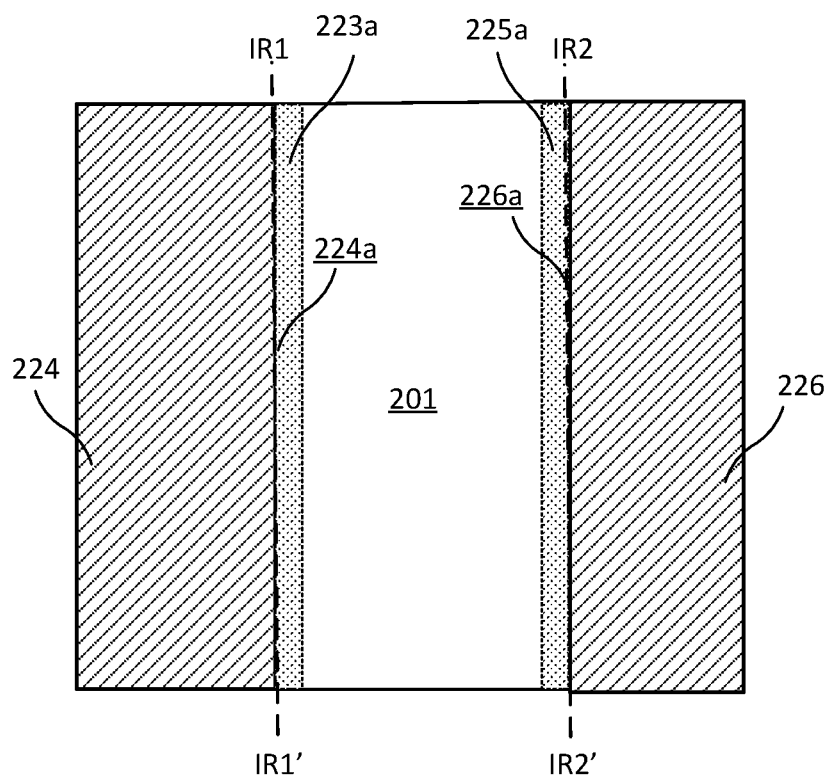
FIG. 2B is a schematic plan view of ohmic contacts and a channel region of the GaN HEMT structure 200 of FIG. 2A.

FIG. 2B is a schematic plan view of ohmic contacts and a channel region of the GaN HEMT structure 200 of FIG. 2A. As illustrated in FIG. 2B, ohmic contact 224 is on doped contact region 223 adjacent channel region 201. Doped contact region 223 can include two portions, a first portion of 223 covered by ohmic contact 224 and a second portion 223a uncovered by ohmic contact 224. The ohmic contact 224 includes an interface region having a length indicated by the line IR1-IR1' between the ohmic contact 224 and the doped contact region 223 (e.g., second portion 223a uncovered by ohmic contact 224) and/or channel region 201. As illustrated in FIG. 2B, an interface length 224a of ohmic contact 224 is about the same as the length of the interface region IR1-IR1'.

Ohmic contact 226 is on doped contact region 225 adjacent channel region 201. Doped contact region 225 can include two portions, a first portion of 225 covered by ohmic contact 226 and a second portion 225a uncovered by ohmic contact 226. The ohmic contact 226 includes an interface region having a length indicated by the line IR2-1R2' between the ohmic contact 226 and the doped contact region 225 (e.g., second portion 225a uncovered by ohmic contact 226) and/or channel region 201. As illustrated in FIG. 2B, an interface length 226a of ohmic contact 226 is about the same as the length of the interface region IR2-1R2'.

Although not wishing to be bound by any particular theory, it is believed that, in a transistor, the presence of interface regions (e.g., interface regions IR1-IR1' and IR2-1R2') having an interface length (e.g., 224a, 226a) that is about the same as a length of the interface region allows total contact resistance of a transistor to be adversely affected by current crowding. Moreover, as an overall size of a transistor decreases, including a decrease in a dimension(s) of the channel region, total contact resistance may prevent the transistor from achieving appropriate performance, for example, at higher frequencies. Some embodiments provide an ohmic contact(s) that includes an interface region comprising an interface length between the ohmic contact and doped contact region larger than a length of the interface region. In some embodiments, the interface length includes at least one indentation. Inclusion of at least one indentation can increase the length of the interface length. By increasing the length of the interface length to be greater than a length of the interface region, current crowding may be decreased and total contact resistance of the transistor may be improved.

In some embodiments, total contact resistance of the transistor can be scaled as a dimension of a channel region decreases based on inclusion of an ohmic contact including an interface length between the ohmic contact and the doped contact region larger than a length of the interface region.

In some embodiments, a transistor includes a semiconductor layer (e.g., barrier layer 222 or channel layer 220). The transistor further includes a channel region (e.g., channel region 201), and a first doped contact region (e.g., doped contact region 223) in the semiconductor layer and adjacent the channel region. The first doped contact region can include a first portion covered by a first ohmic contact (e.g., ohmic contact 224) and a second portion (e.g., second portion 223a) uncovered by the first ohmic contact. The first ohmic contact (e.g., ohmic contact 224) includes an interface region including a first interface length between the first ohmic contact and the first doped contact region larger than a length of the interface region (e.g., edges described herein with reference to FIGS. 3A, 3B, 4A, and 4B).

In some embodiments, the semiconductor layer includes a group III nitride layer.

In some embodiments, the transistor further includes a second doped contact region (e.g., doped contact region 225) in the semiconductor layer and adjacent the channel region (e.g., channel region 201). The second doped contact region can include a first portion covered by a second ohmic contact (e.g., ohmic contact 226) and a second portion (e.g., second portion 225a) uncovered by the second ohmic contact. The second ohmic contact (e.g., ohmic contact 226) includes an interface region comprising a second interface length between the second ohmic contact and the second doped contact region larger than a length of the interface region (e.g., edges described herein with reference to FIGS. 3A, 3B, 4A, and 4B).

In some embodiments, ohmic contact 224 comprises an ohmic source contact or an ohmic drain contact, and ohmic contact 226 comprises (i) an ohmic drain contact when contact 224 is an ohmic source contact, or (ii) an ohmic source contact when the contact 224 is an ohmic drain contact.

In some embodiments, the first interface length includes at least one indentation and/or the second interface length includes at least one indentation.

An ohmic contact(s) of the transistor of various embodiments can take many different shapes and sizes. FIGS. 3A, 3B, 4A, and 4B show variations in accordance with some embodiments of the present disclosure. Portions of the structure of the transistor of FIGS. 3A, 3B, 4A, and 4B, other than an interface length of ohmic contacts 224, 226 and a shape/length of second portions 223a, 225a of doped contact regions 223, 225, are substantially the same or similar as those illustrated in FIGS. 2A and 2B, and a repeat description thereof will be omitted for brevity. The transistor device of FIGS. 3A, 3B, 4A, and 4B may share a substantially similar cross-sectional view as the GaN HEMT structure 200 of FIG. 2A and, as such, a duplicate illustration is omitted.

FIGS. 3A, 3B, 4A, and 4B are intended to represent structures for identification and description and are not intended to represent the structures to physical scale. In addition, though FIGS. 3A, 3B, 4A, and 4B are illustrated so as to allow for general comparison with the structure of FIG. 2B, it will be understood that the scale of FIG. 2B is not intended to be identical to that of FIGS. 3A, 3B, 4A, and 4B.

Figure 3A:
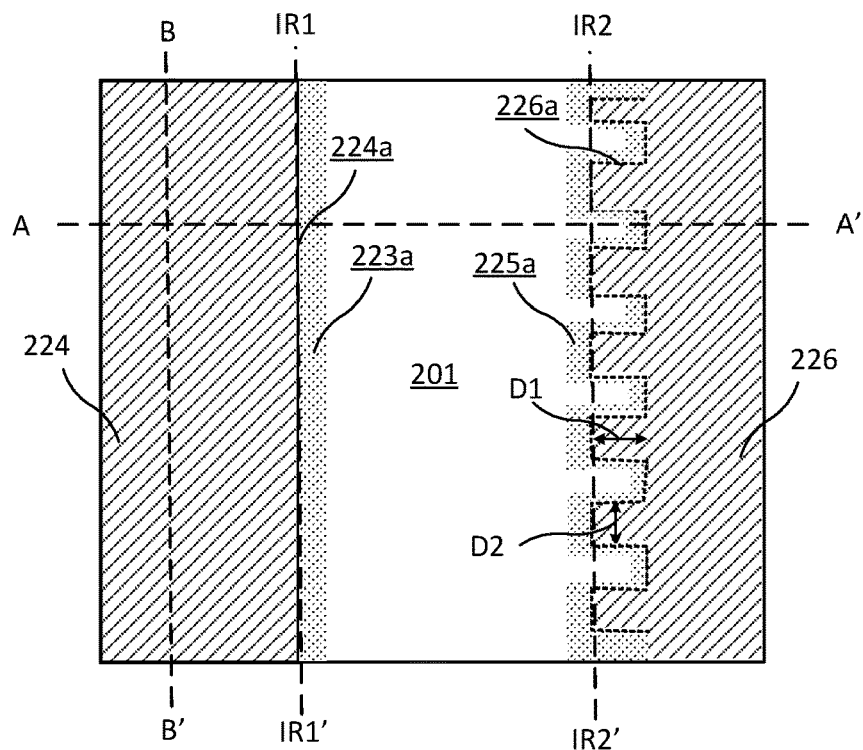
FIGS. 3A and 3B are schematic plan views of a transistor according to various embodiments.

The transistor of the embodiments illustrated in FIGS. 3A, 3B, 4A, and 4B can have a size of about 5 µm to 500 µm in the direction of the line B-B' in FIG. 3A, as the size of the structure of the transistor (e.g., GaN HEMT structure 200) decreases, the distance of channel region 201 in the direction of the line A-A' between first interface length 224a and second interface length 226a also decreases. In some embodiments, the channel region has a width of about 5 µm or less.

FIG. 3A shows an example embodiment of a transistor of the present disclosure.

As shown in FIG. 3A ohmic contact 224 has a first interface length 224a adjacent the second portion 223a of the doped contact region 223 and adjacent channel region 201. The first interface length is about the same as the length of the interface region IR1-IR1'. Ohmic contact 226 has a second interface length 226a adjacent the second portion 225a of the doped contact region 225 and channel region 201. As illustrated in the example embodiment of FIG. 3A, the interface length 226a is longer than a length of the interface region IR2-IR2' due to the presence of indentations on the second interface length 226a. As illustrated in FIG. 3A, in some embodiments, the indentations of second interface length 226a have a piecewise tooth shape with a space between adjacent teeth. The piecewise tooth shape of an indentation has a depth "D1" and a width "D2". In some embodiments, the depth D1 can range from about 1 µm and 5 µm. Larger depths D1, however, may result in an increased total contact resistance that may prevent the transistor from achieving appropriate performance at higher frequencies. In some embodiments, the width D2 can range from about 1.4 µm and 3 µm. Although not wishing to be bound by a particular theory, it is believed that as a sheet resistance of the doped contact region 225 beneath ohmic contact 226 decreases, the width D2 of a piecewise indentation on second interface length 226a may increase.

Figure 3B:
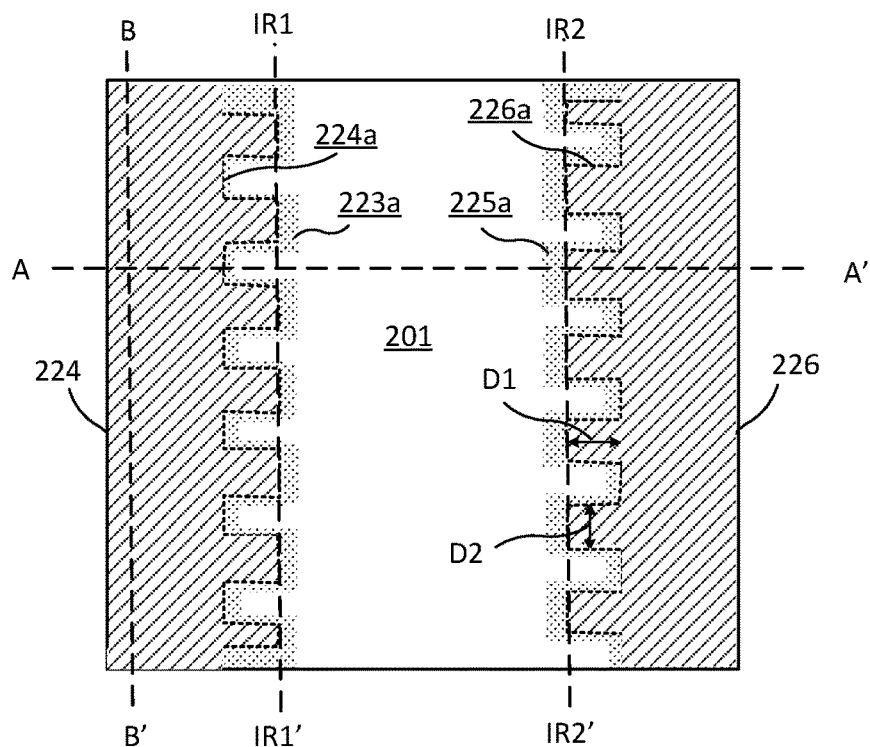

FIG. 3B shows another example embodiment of the present disclosure that is similar to the transistor of FIG. 3A.

However, in this embodiment, the interface lengths 224a, 226a of both ohmic contacts 224 and 226 have a plurality of indentations. As shown in FIG. 3B ohmic contact 224 has a first interface length 224a that includes indentations adjacent the second portion 223a of the doped contact region 223 and channel region 201; and ohmic contact 226 has a second interface length 226a that includes indentations adjacent the second portion 225a of the doped contact region 225 and channel region 201. As illustrated in the example embodiment of FIG. 3B, the interface lengths 224a, 226a are longer than a length of the interface regions IR1-IR1' and IR2-1R2', respectively, due to the presence of indentations on the first interface length 224a and the second interface length 226a. The indentations of the first and second interface lengths 224a, 226a have a piecewise tooth shape with a space between adjacent teeth. The piecewise tooth shape of an indentation has a depth "D1" and a width "D2". The depth D1 and width D2 are similar to those of FIG. 3A.

Figure 4A:
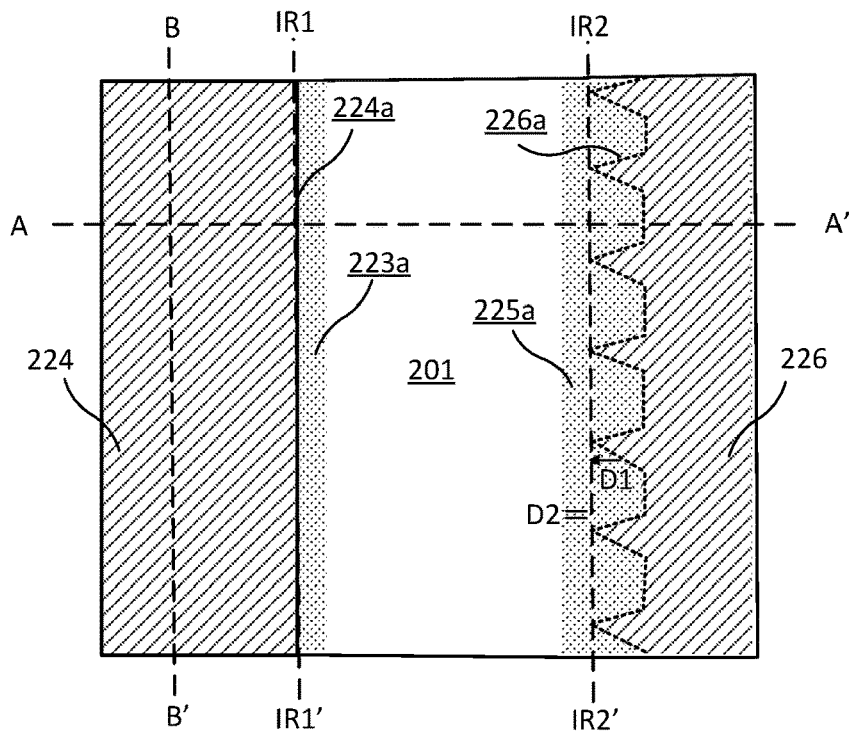
FIGS. 4A and 4B are schematic plan views of a transistor according to various embodiments.

FIG. 4A shows another example embodiment of the present disclosure that is similar to the transistor of FIG. 3A.

However, in this embodiment, ohmic contact 224 has a first interface length 224a adjacent the second portion 223a of the doped contact region 223 and adjacent channel region 201. The first interface length is about the same as the length of the interface region IR1-IR1'. Ohmic contact 226 has a second interface length 226a adjacent the second portion 225a of the doped contact region 225 and channel region 201. Ohmic contact 226 has a second interface length 226a adjacent the second portion 225a of the doped contact region 225 and channel region 201. As illustrated in the example embodiment of FIG. 4A, the interface length 226a is longer than a length of the interface region IR2-1R2' due to the presence of indentations that have a jagged shape. The indentations of the second interface length 226a have a piecewise jagged shape with a space between adjacent jagged shapes. The piecewise jagged shape of an indentation has a depth "D1" and a width "D2". The depth D1 and width D2 are similar to those of FIG. 3A.

Figure 4B:
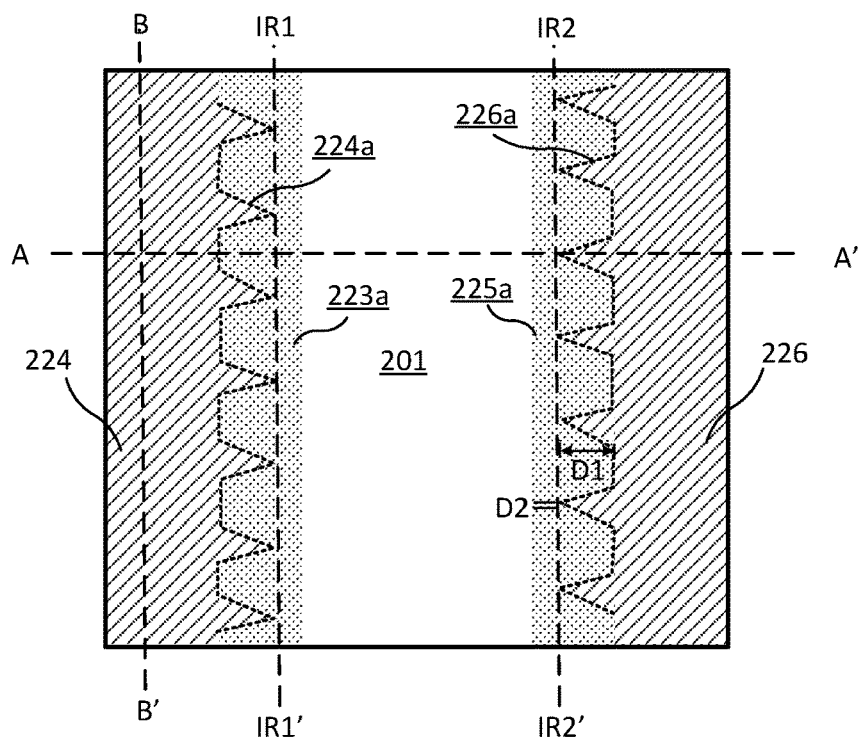

FIG. 4B shows another example embodiment of the present disclosure that is similar to the transistor of FIG. 3B.

However, in this embodiment, first and second interface lengths 224a, 226a of both ohmic contacts 224 and 226 include a plurality of indentations that have a jagged shape. As shown in FIG. 4B ohmic contact 224 has a first interface length 224a that includes indentations adjacent the second portion 223a of the doped contact region 223 and channel region 201; and ohmic contact 226 has a second interface length 226a that includes indentations adjacent the second portion 225a of the doped contact region 225 and channel region 201. As illustrated in the example embodiment of FIG. 4B, the interface lengths 224a, 226a are longer than a length of the interface regions IR1-IR1' and IR2-1R2', respectively, due to the presence of indentations on the first interface length 224a and the second interface length 226a. The indentations of first and second interface lengths 224a, 226a have a piecewise jagged shape with a space between adjacent jagged shapes. The piecewise jagged shape of an indentation has a depth "D1" and a width "D2". The depth D1 and width D2 are similar to those of FIG. 3A.

While the embodiments of FIGS. 3A, 3B, 4A, and 4B illustrate an interface length of an ohmic contact as including indentations, the present disclosure is not so limited. Instead, any shape or pattern may be included along the interface length including, without limitation, curves, serpentine shapes, notches, saw shapes, jagged shapes, a non-straight boundary, cut out portions (including, but not limited to, enclosed cutout portions that still increase the interface length), regular or irregular protrusions, combinations of any of the aforementioned, etc. Moreover, while some embodiments illustrate a plurality of indentations on a first interface length and/or a second interface length of a first ohmic contact and/or a second ohmic contact, the present disclosure is not so limited. Instead, indentations of any quantity maybe included along an interface length (e.g., one or more indentations along an interface length). Although not wishing to be bound by a particular theory, it is believed that as the quantity of indentations along an interface length increases, the total contact resistance decreases.

In some embodiments, as illustrated in the example embodiments of FIGS. 3B and 4B, when the first and second ohmic contact have a first interface length and a second interface length, respectively, that include a plurality of indentations, the plurality of indentations of the first interface length are misaligned with the plurality of indentations of the second interface length. For example, FIGS. 3B and 4B illustrate such misalignment with reference to the line A-A' which shows that a piecewise shape of the plurality of indentations of the first interface length 224a is offset with respect to a piecewise shape of the plurality of indentations of the second interface length 226a. If indentations of the first and second interface lengths shift away from an offset and trend towards being aligned, however, total contact resistance may increase.

While various embodiments are described with reference to indentations that include teeth or jagged shapes, the present disclosure is not so limited, and includes many shapes (e.g., rounded, curved, stubs, saw shapes, notches, etc.) that increase the interface length between the ohmic contact and the doped contact region and/or channel region such that the interface length is larger than a length of the interface region. Additionally, while various embodiments are described with reference to FIGS. 3A, 3B, 4A, and 4B illustrating an interface region that is coextensive in length along the line IR1-IR1' and/or IR2-IR2' with a length of the transistor along line B-B', the present disclosure is not so limited, and includes an interface region(s) that has a length that is smaller than a length of the transistor along line B-B'.

Figure 5:
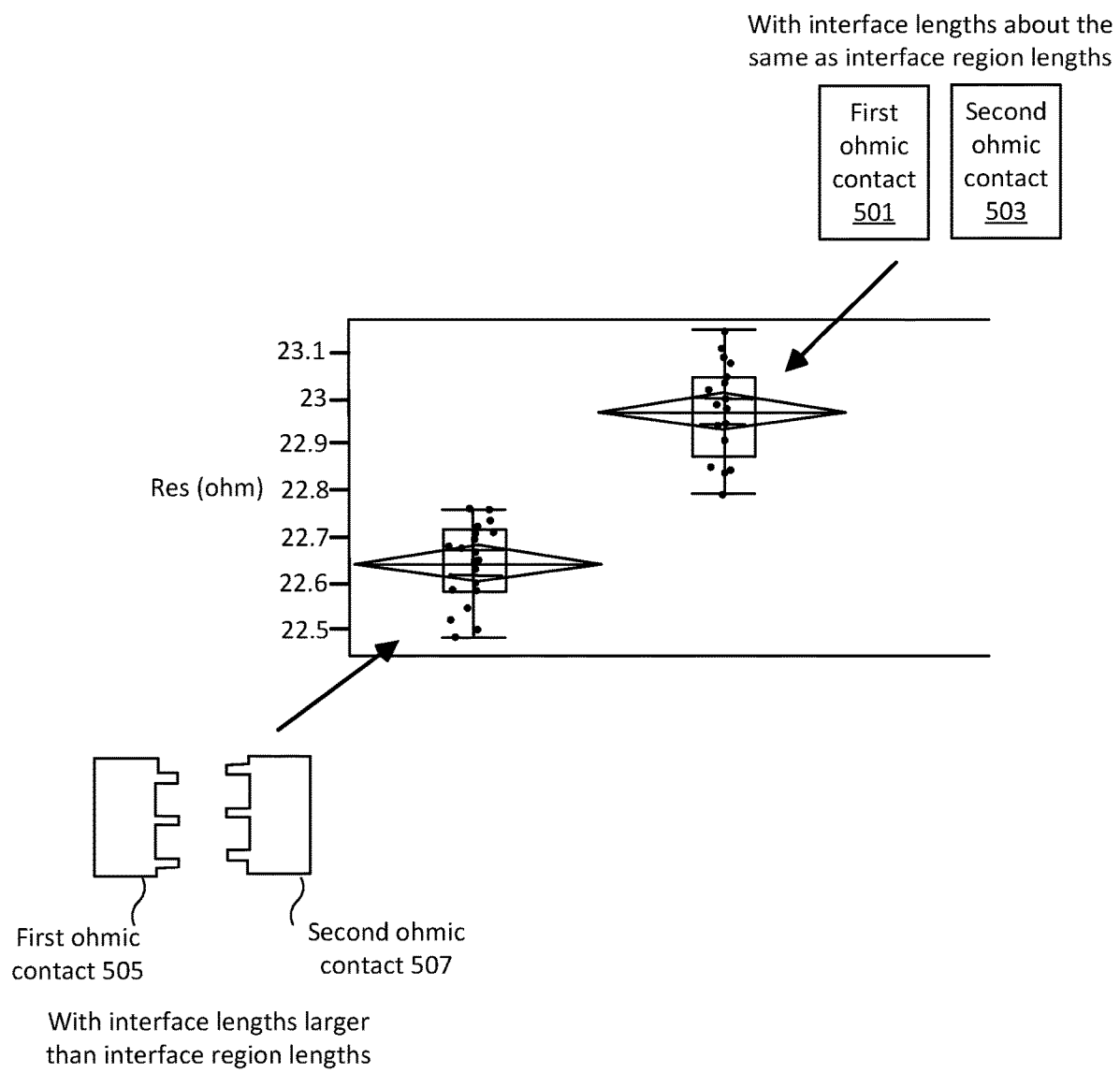
FIG. 5 illustrates results of a test setup including a gallium nitride (GaN) HEMT including ohmic contacts without indentations and a GaN HEMT including ohmic contacts with indentations according to various embodiments.

The presence of an ohmic contact that includes an interface region having an interface length between the ohmic contact and the doped contact region and/or the channel region that is larger than a length of the interface region may reduce total contact resistance of a transistor according to some embodiments. For example, FIG. 5 illustrates results of a test setup including (1) a conventional GaN HEMT transistor that included two ohmic contacts with interface lengths that are about the same as a length of the respective interface regions, and (2) a GaN HEMT transistor including two ohmic contacts that included misaligned indentations of interface lengths having a length larger than the length of the respective interface regions as described herein. The conventional GaN HEMT transistor and the GaN HEMT transistor in accordance with some embodiments of the present disclosure had a gap of about 5 μm between the interface region of the first ohmic contact and the second ohmic contact of the respective devices.

Referring to FIG. 5, devices with interface lengths that are about the same as a length of respective interface regions (upper right graph) and with interface lengths having a length larger than the length of respective interface regions (lower left graph) were subjected to a load. In particular, the device transient behaviors were tested with a current and voltage meter. A constant current was forced through one ohmic contact while the other ohmic contact was grounded. The resulting voltage was measured across the two ohmic contacts and used to determine the resistance with ohms law. The resulting total contact resistance of the tested devices is shown in the graph.

Devices with a first ohmic contact 501 and a second ohmic contact 503 having interface lengths that are about the same as a length of the respective interface regions had a normalized total contact resistance (Res (ohm)) of about 0.23 ohm-mm. This is believed to be influenced by the presence of interface lengths that are about the same as a length of the respective interface regions. However, as can be seen in FIG. 5, the devices with first and second ohmic contacts 505, 507 with interface lengths having a length larger than the length of the respective interface regions had a normalized total contact resistance (Res (ohm)) that was reduced by about 7% (that is a reduction of about 0.4 ohm-mm). It is believed that the increased length of the first and second interface lengths of first and second ohmic contacts 505, 507 improved the total contact resistance.

While again not wishing to be bound by a particular theory of operation, it is believed that total contact resistance may be reduced by reducing an effective width of the channel region by including an interface length between the ohmic contact and the doped contact region and/or channel region larger than a length of the interface region. That is, when an interface length of an ohmic contact is larger than a length of the interface region, it is believed that sheet resistance of the doped contact region beneath the ohmic contact is reduced relative to a resistance in the channel region.

In some embodiments, the ohmic contact with an interface length between the ohmic contact and the doped contact region and/or channel region larger than a length of the interface region has a resistance that is less than a resistance of the channel region. As a consequence, total contact resistance may be reduced.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 6A-6C.

Figure 6A:
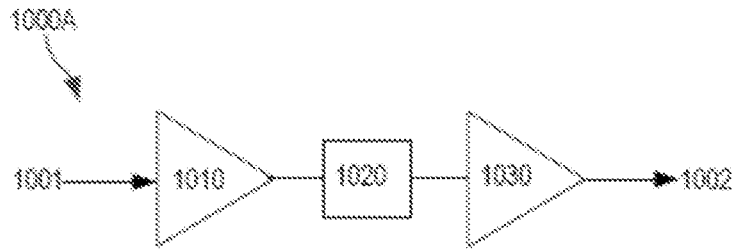
FIGS. 6A-6C are schematic block diagrams of multi-amplifier circuits in which RF transistor amplifiers incorporating transistor devices according to embodiments may be used.

Referring to FIG. 6A, an RF transistor amplifier 1000A is schematically illustrated that includes a pre-amplifier 1010 and a main amplifier 1030 that are electrically connected in series. As shown in FIG. 6A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 6A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 6B:
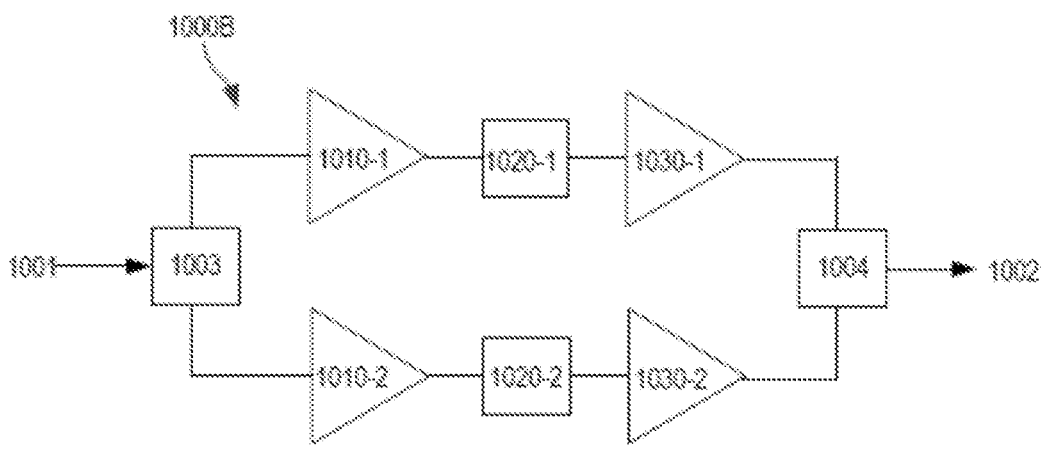

Referring to FIG. 6B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 6C:
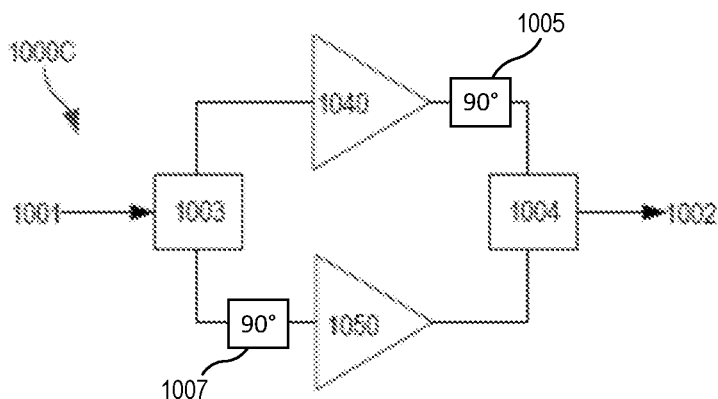

As shown in FIG. 6C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 6C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 7:
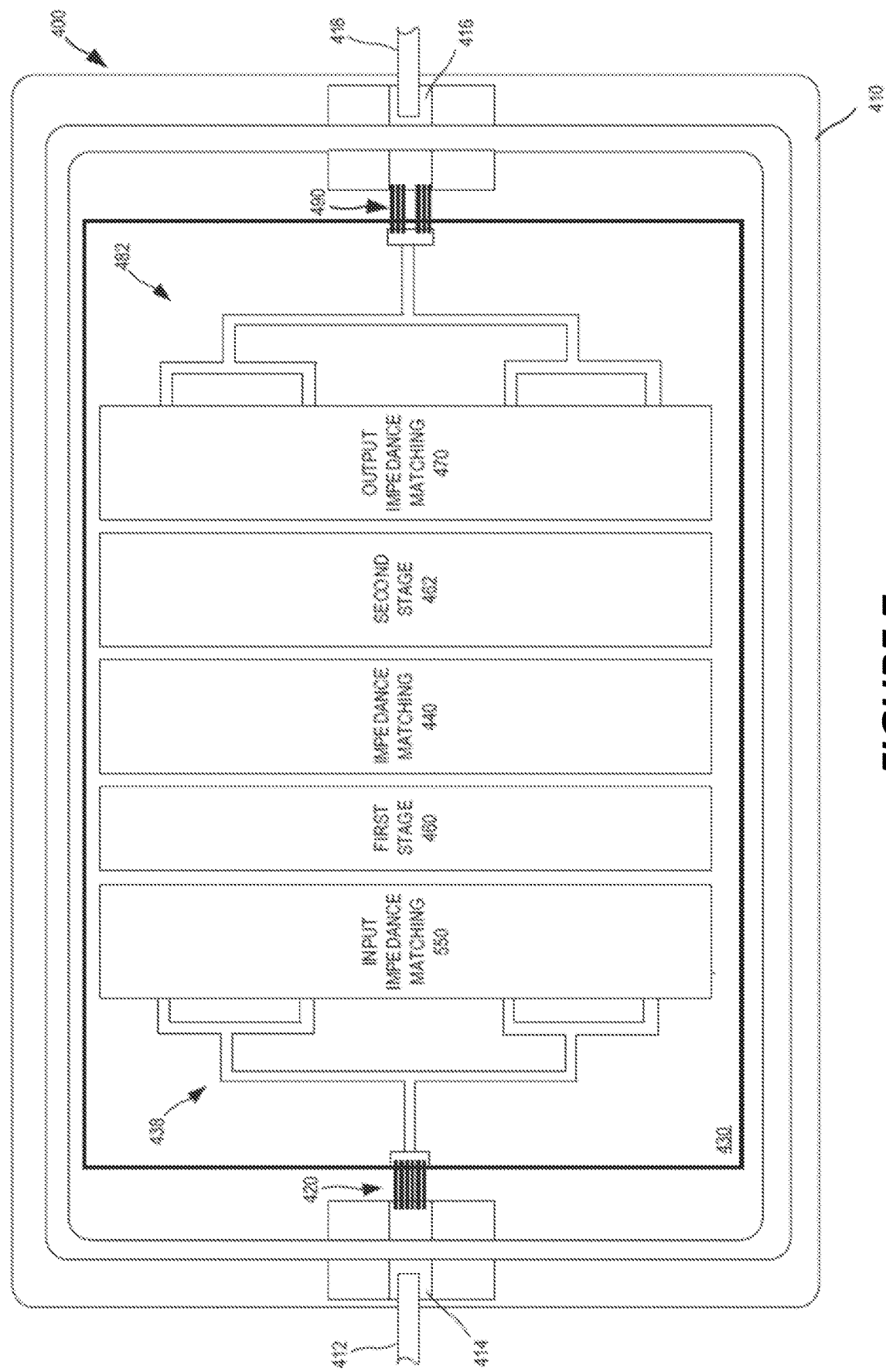
FIG. 7 is a schematic illustration of a MMIC amplifier including a HEMT transistor according to some embodiments.

FIG. 7 is a plan view of a MMIC RF transistor amplifier 400 according to embodiments of the present inventive concepts. As shown in FIG. 7, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 8A:
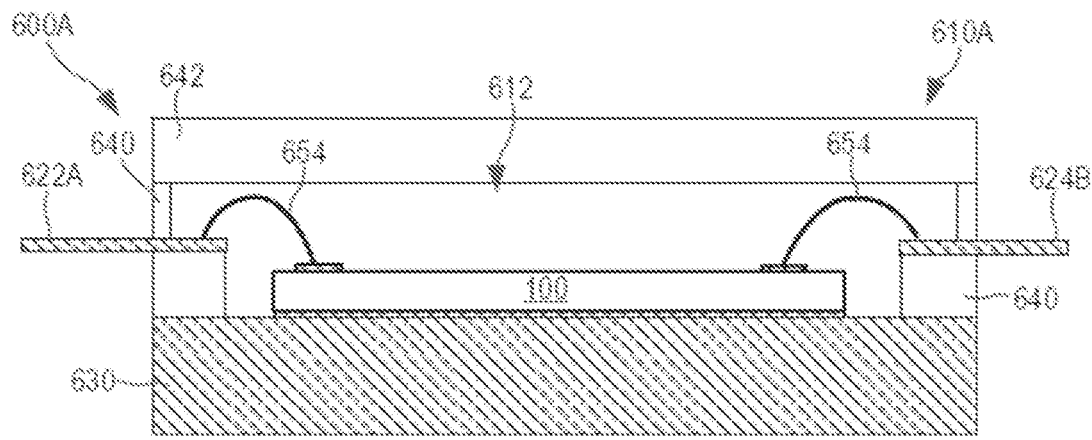
FIGS. 8A and 8B are schematic cross-sectional views illustrating example packages for RF transistor amplifier dies according to some embodiments.
Figure 8B:
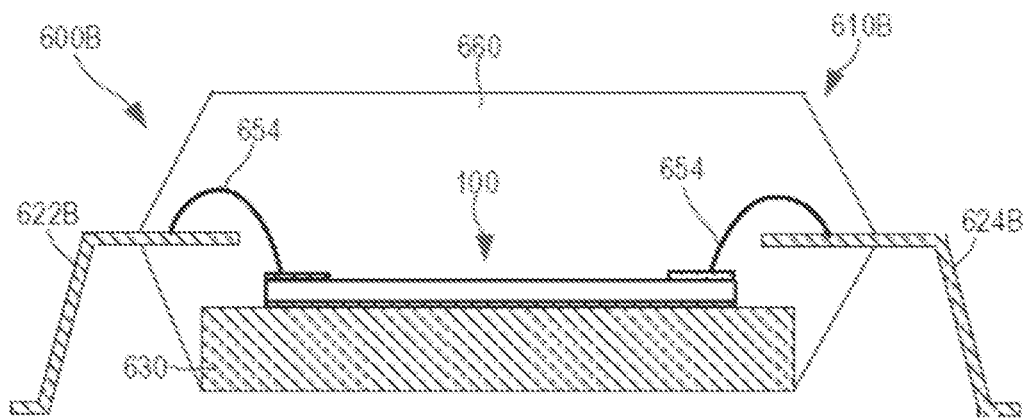

FIGS. 8A and 8B are schematic cross-sectional views illustrating several example ways that that the RF transistor amplifier dies according to embodiments of the present inventive concepts may be packaged to provide packaged RF transistor amplifiers 600A and 600B, respectively.

FIG. 8A is a schematic side view of a packaged Group III nitride-based RF transistor amplifier 600A. As shown in FIG. 8A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 8B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The indentations of am edge of an ohmic contact can also have many different sizes and shapes. Accordingly, the spirit and scope of the invention should not be limited to the specific embodiments described above.

What is claimed is:

1. A transistor, comprising:
    a semiconductor layer;
    a channel region;
    a first doped contact region in the semiconductor layer and adjacent the channel region; and
    a first ohmic contact comprising a first interface region having a first interface region length extending along a length of the channel region, the first interface region comprising a first interface length extending along the length of the channel region between the first ohmic contact and the first doped contact region larger than the first interface region length of the first interface region.

2. The transistor of claim 1, wherein the semiconductor layer comprises a group III nitride layer.

3. The transistor of claim 1, wherein a first resistance of the first ohmic contact is less than a second resistance of the channel region.

4. The transistor of claim 1, wherein the first ohmic contact is one of an ohmic source contact and an ohmic drain contact.

5. The transistor of claim 1, further comprising:
    a second doped contact region in the semiconductor layer and adjacent the channel region; and
    a second ohmic contact comprising a second interface region having a second interface region length extending along the length of the channel region, the second interface region comprising a second interface length extending along the length of the channel region between the second ohmic contact and the second doped contact region larger than the second interface region length of the second interface region.

6. The transistor of claim 5, wherein the first ohmic contact comprises an ohmic source contact or an ohmic drain contact, and the second ohmic contact comprises (i) an ohmic drain contact when the first ohmic contact is an ohmic source contact or (ii) an ohmic source contact when the first ohmic contact is an ohmic drain contact.

7. The transistor of claim 1, wherein the first interface length extending along the length of the channel region between the first ohmic contact and the first doped contact region comprises at least one indentation.

8. The transistor of claim 7, wherein the at least one indentation of the first interface length extending along the length of the channel region between the first ohmic contact and the first doped contact region comprises a plurality of indentations and wherein the plurality of indentations comprise teeth with a space between adjacent teeth.

9. The transistor of claim 8, wherein the at least one indentation of the first interface length extending along the length of the channel region between the first ohmic contact and the first doped contact region comprises a plurality of indentations and wherein the plurality of indentations comprise jagged shapes with a space between adjacent jagged shapes.

10. The transistor of claim 7, wherein a depth of the at least one indentation of the first interface length extending along the length of the channel region between the first ohmic contact and the first doped contact region is between 1 μm and 5 μm.

11. The transistor of claim 7, wherein a width of the at least one indentation of the first interface length extending along the length of the channel region between the first ohmic contact and the first doped contact region is between 1.4 μm and 3 μm.

12. The transistor of claim 1, wherein the channel region has a width of 5 μm or less.

13. The transistor of claim 1, wherein the first doped contact region comprises a first portion covered by the first ohmic contact and a second portion adjacent the channel region uncovered by the first ohmic contact.

14. The transistor of claim 5, wherein the second doped contact region comprises a first portion covered by the second ohmic contact and a second portion adjacent the channel region uncovered by the second ohmic contact.

15. The transistor of claim 5, wherein the second interface length extending along the length of the channel region between the second ohmic contact and the second doped contact region comprises at least one indentation.

16. The transistor of claim 15, wherein the at least one indentation of the second interface length extending along the length of the channel region between the second ohmic contact and the second doped contact region comprises a plurality of indentations and wherein the plurality of indentations comprise teeth with a space between adjacent teeth.

17. The transistor of claim 15, wherein the at least one indentation of the second interface length extending along the length of the channel region between the second ohmic contact and the second doped contact region comprises a plurality of indentations and wherein the plurality of indentations comprise jagged shapes with a space between adjacent jagged shapes.

18. The transistor of claim 15, wherein the second interface length extending along the length of the channel region between the second ohmic contact and the second doped contact region comprises at least one indentation that is misaligned with the at least one indentation of the second interface length.

19. The transistor of claim 15, wherein a depth of the at least one indentation extending along the length of the channel region between the second ohmic contact and the second doped contact region is between 1 μm and 5 μm, respectively.

20. The transistor of claim 15, wherein a width of the at least one indentation of the second interface length extending along the length of the channel region between the second ohmic contact and the second doped contact region is between 1.4 μm and 3 μm.

21. A high electron mobility transistor, HEMT, with ohmic source and drain contacts, comprising:
    a semiconductor layer;
    a channel region;
    a first doped contact region in the semiconductor layer and adjacent the channel region;
    a second doped contact region in the semiconductor layer and adjacent the channel region;
    a first ohmic contact comprising a first interface region having a first interface region length extending along a length of the channel region, the first interface region comprising a first interface length extending along the length of the channel region between the first ohmic contact and the first doped contact region larger than the first interface region length of the first interface region; and a second ohmic contact comprising a second interface region having a second interface region length extending along the length of the channel region, the second interface region comprising a second interface length extending along the length of the channel region between the second ohmic contact and the second doped contact region larger than the second interface region length of the second interface region.

22. The HEMT of claim 21, wherein a first resistance of at least one of the first ohmic contact and the second ohmic contact is less than a second resistance of the channel region.

23. The HEMT of claim 21, wherein the first ohmic contact comprises an ohmic source contact or an ohmic drain contact, and the second ohmic contact comprises (i) an ohmic drain contact when the first ohmic contact is an ohmic source contact or (ii) an ohmic source contact when the first ohmic contact is an ohmic drain contact.

24. The HEMT of claim 21, wherein the first interface length extending along the length of the channel region between the first ohmic contact and the first doped contact region comprises at least one indentation and the second interface length extending along the length of the channel region between the second ohmic contact and the second doped contact region comprises at least one indentation.

25. The HEMT of claim 24, wherein of the at least one indentation of the first interface length extending along the length of the channel region between the first ohmic contact and the first doped contact region is misaligned with the at least one indentation of the second interface length extending along the length of the channel region between the second ohmic contact and the second doped contact region.

26. The HEMT of claim 24, wherein a depth of the at least one indentation of at least one of the first and second interface lengths is between 1 μm and 5 μm, and a width of the at least one indentation of at least one of the first and second interface lengths is between 1.4 μm and 3 μm.

* * * * *